United States Patent
Takakura

(10) Patent No.: US 10,754,257 B2
(45) Date of Patent: Aug. 25, 2020

(54) METHOD OF MANUFACTURING PATTERN AND ARTICLE MANUFACTURING METHOD

(71) Applicant: CANON KABUSHIKI KAISHA, Tokyo (JP)

(72) Inventor: Noburu Takakura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/515,541

(22) Filed: Jul. 18, 2019

(65) Prior Publication Data

US 2020/0026202 A1    Jan. 23, 2020

(30) Foreign Application Priority Data

Jul. 23, 2018    (JP) ................................ 2018-138012

(51) Int. Cl.
     *G03F 7/20*      (2006.01)

(52) U.S. Cl.
     CPC .......... *G03F 7/7045* (2013.01); *G03F 7/2047* (2013.01); *G03F 7/7035* (2013.01); *G03F 7/70633* (2013.01)

(58) Field of Classification Search
     CPC ........ G03F 7/2047; G03F 7/70; G03F 7/7035; G03F 7/7045; G03F 7/70633
     USPC ............................................. 355/53, 77, 78
     See application file for complete search history.

(56) References Cited

U.S. PATENT DOCUMENTS

| | | |
|---|---|---|
| 7,420,654 B2 | 9/2008 | Cherala et al. |
| 9,372,396 B2 | 6/2016 | Kruijt-Stegeman et al. |

| | | | |
|---|---|---|---|
| 2004/0157143 A1 | 8/2004 | Taniguchi | |
| 2015/0008605 A1* | 1/2015 | Sato | ..... G03F 7/0002 264/40.1 |
| 2017/0043511 A1* | 2/2017 | Sato | ..... B29C 43/58 |
| 2017/0227855 A1* | 8/2017 | Hayashi | ..... G03F 7/7045 |
| 2017/0285495 A1* | 10/2017 | Sakamoto | ..... G03F 7/0002 |
| 2017/0351182 A1* | 12/2017 | Mizumoto | ..... G03F 7/70633 |

FOREIGN PATENT DOCUMENTS

| | | |
|---|---|---|
| JP | H06310399 A | 11/1994 |
| JP | H0757991 A | 3/1995 |
| JP | 2008504141 A | 2/2008 |
| JP | 2010098310 A | 4/2010 |
| JP | 2016154241 A | 8/2016 |
| WO | 9936949 A1 | 7/1999 |
| WO | 2005121892 A2 | 12/2005 |

\* cited by examiner

*Primary Examiner* — Colin W Kreutzer

(74) *Attorney, Agent, or Firm* — Rossi, Kimms & McDowell LLP

(57) ABSTRACT

A method includes first step of forming first pattern in each of first region of a substrate by using scanning exposure apparatus, and second step of forming second pattern in each second region of the substrate having undergone the first step. Each second region includes at least two first regions, and in the first step, scanning direction in the scanning exposure apparatus is allocated to each of the at least two first regions. Combination of the scanning directions allocated to the at least two first regions is common to the second regions. The combination is determined such that the scanning directions of at least first regions, of the at least two first regions, which are arranged in a direction perpendicular to the scanning directions are alternately changed one by one.

13 Claims, 14 Drawing Sheets

☐ MARK FOR X-DIRECTION MEASUREMENT
☐ MARK FOR Y-DIRECTION MEASUREMENT

☐ MARK FOR X-DIRECTION MEASUREMENT
☐ MARK FOR Y-DIRECTION MEASUREMENT

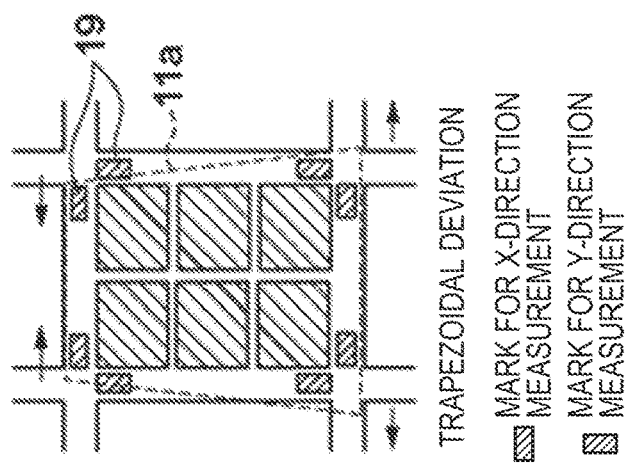
FIG. 4A POSITIONAL DEVIATION
FIG. 4B MAGNIFICATION DEVIATION
FIG. 4C TRAPEZOIDAL DEVIATION
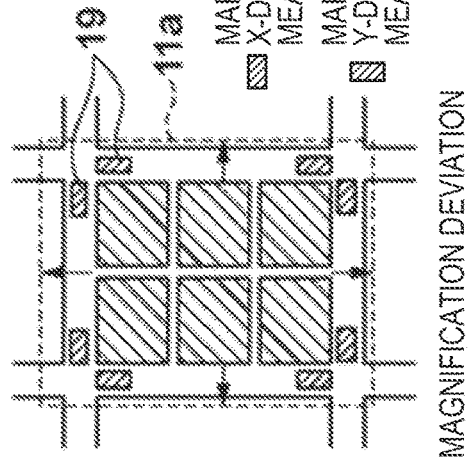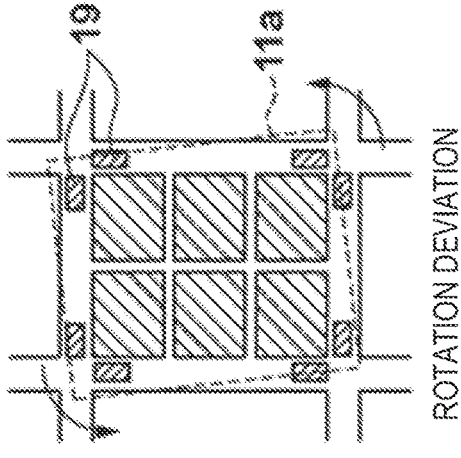
FIG. 4D TWIST DEVIATION
FIG. 4E ROTATION DEVIATION
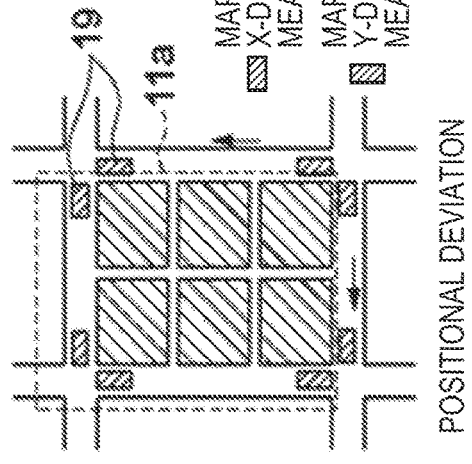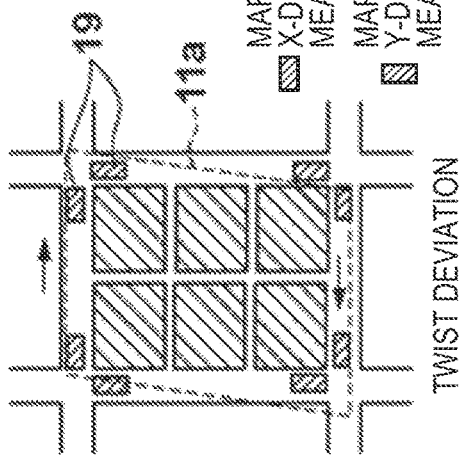

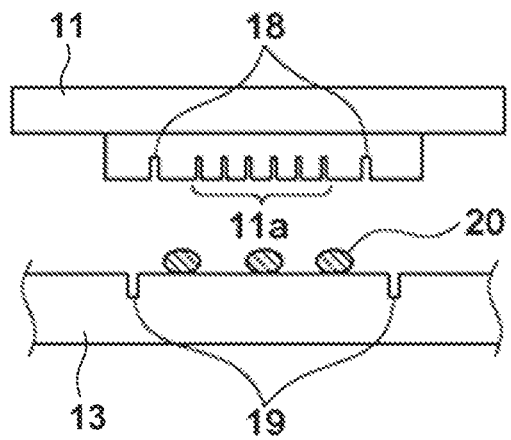
F I G. 5A
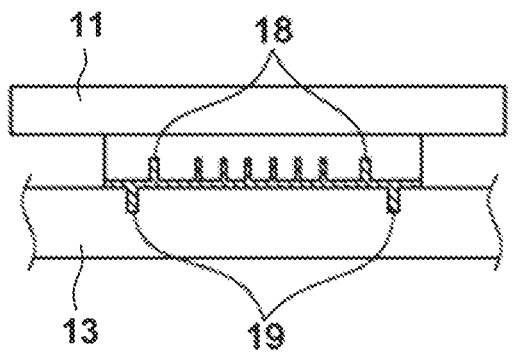
F I G. 5B
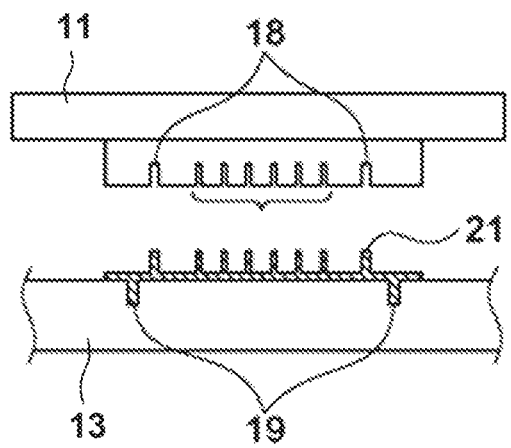
F I G. 5C

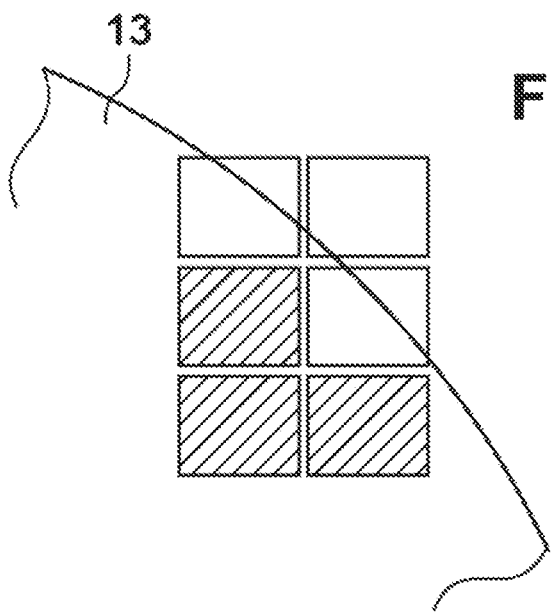
FIG. 6
FIG. 7
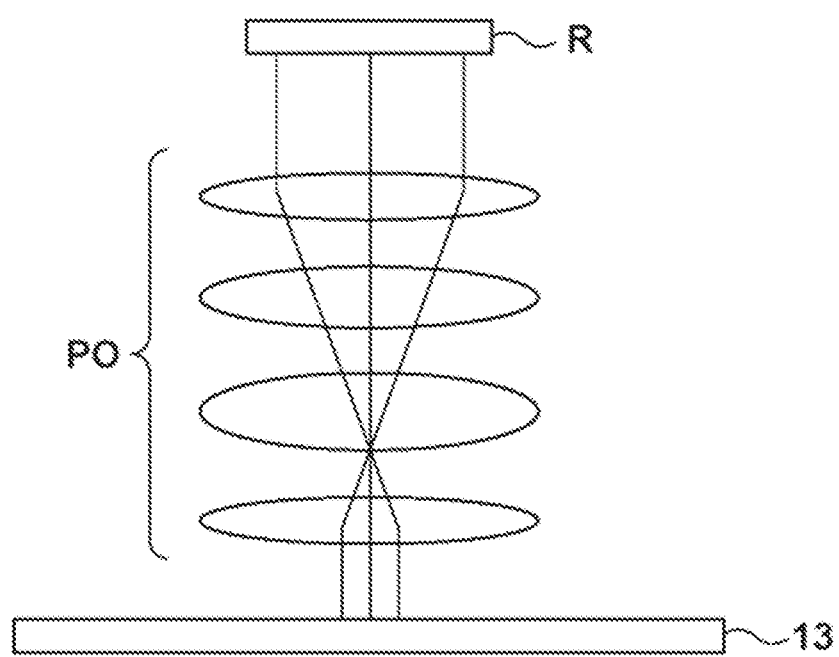

METHOD OF MANUFACTURING PATTERN AND ARTICLE MANUFACTURING METHOD

BACKGROUND OF THE INVENTION

Field of the Invention

The present invention relates to a method of manufacturing a pattern and an article manufacturing method.

Description of the Related Art

An imprint technique is a technique capable of transferring nanoscale micropatterns, and is beginning to be put into practical use as one nanolithography technique for mass-production of magnetic storage media or semiconductor devices. In the imprint technique, a mold on which a micropattern is formed by using an electron beam drawing apparatus or the like is used as an original, and the micropattern is formed on a substrate such as a silicon substrate or a glass plate. This micropattern is formed by coating the substrate with an imprint material, and curing the imprint material in a state in which the mold is brought into contact with the imprint material. An imprint technique like this is disclosed in, for example, Japanese Patent Laid-Open No. 2010-098310.

To achieve a required overlay accuracy, it is necessary to accurately match the shape of a pattern region of a mold with the shape of a shot region of a substrate. Japanese Patent Laid-Open No. 2008-504141 describes an imprint apparatus including a correction mechanism for correcting the pattern shape of a mold by applying a force to the mold.

In relation to a reduction in overlay error, International Publication No. 99/36949 describes a method by which, between exposure apparatuses adopting different transfer methods, projection optical systems of these apparatuses are adjusted to shapes easily correctable by the projection optical systems, and correction is performed by thus matching the shapes.

Japanese Patent Laid-Open No. 2016-154241 describes a method by which, in a plurality of shot regions in which patterns are formed by using a scanning exposure apparatus, patterns are simultaneously formed by using an imprint apparatus in a step after that. Japanese Patent Laid-Open No. 2016-154241 further describes that, for the plurality of shot regions in which patterns are formed by using the imprint apparatus, the scanning directions of scanning exposure to be performed by the scanning exposure apparatus in advance are the same.

According to the method described in Japanese Patent Laid-Open No. 2016-154241, a high overlay accuracy is expected between the pattern formed by using the scanning exposure apparatus and the pattern to be formed on the former pattern by using the imprint apparatus. However, when the scanning exposure apparatus performs scanning exposure on a plurality of adjacent shot regions in the same scanning direction, the throughput significantly decreases.

SUMMARY OF THE INVENTION

The present invention provides a technique advantageous in improving the throughput and the overlay accuracy.

One of aspects of the present invention provides a method of manufacturing a pattern on a substrate, comprising: first forming of forming a first pattern in each of a plurality of first regions of the substrate by using a scanning exposure apparatus; and second forming of forming a second pattern in each of a plurality of second regions of the substrate having undergone the first forming, wherein each of the plurality of second regions includes at least two first regions of the plurality of first regions, and in the first forming, a scanning direction in scanning exposure performed by the scanning exposure apparatus is allocated to each of the at least two first regions, a combination of the scanning directions allocated to the at least two first regions is common to the plurality of second regions, and the combination is determined such that the scanning directions of at least first regions, of the at least two first regions, which are arranged in a direction perpendicular to the scanning directions are alternately changed one by one.

Further features of the present invention will become apparent from the following description of exemplary embodiments with reference to the attached drawings.

BRIEF DESCRIPTION OF THE DRAWINGS

FIGS. 4A to 4E are views exemplarily showing pattern shape differences between a mold and a substrate;

FIGS. 5A to 5C are views exemplarily showing an imprint process;

FIG. 6 is a view exemplarily showing the relationship between a pattern region of the mold and the edge of the substrate;

FIG. 7 is a view exemplarily showing a scanning exposure apparatus:

DESCRIPTION OF THE EMBODIMENTS

A method of manufacturing a pattern according to the present invention will be explained below by way of its exemplary embodiment.

Figure 1:
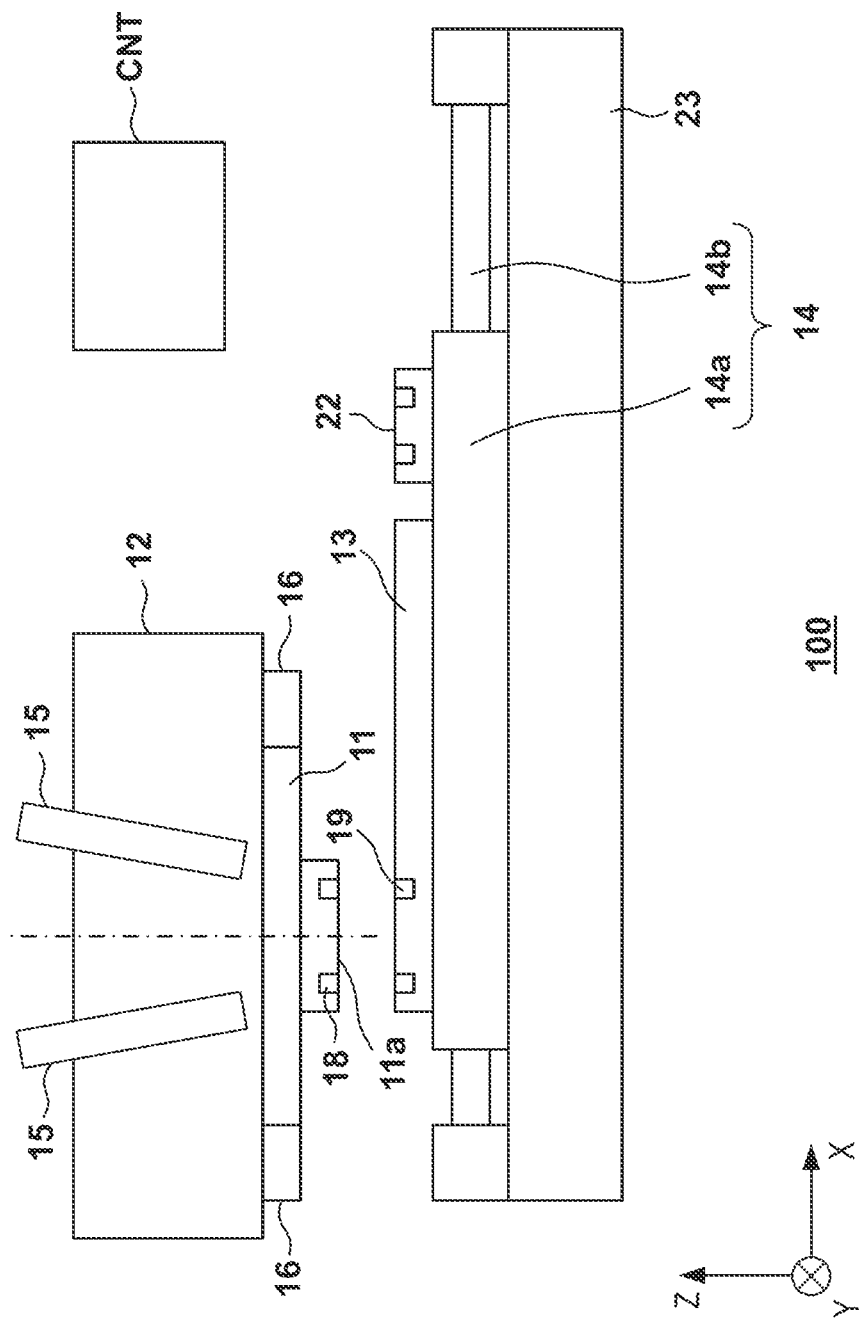
FIG. 1 is a view exemplarily showing an imprint apparatus.

FIG. 1 shows the arrangement of an imprint apparatus 100 to be used in this embodiment. The imprint apparatus 100 cures an imprint material arranged on a substrate in a state in which the imprint material and a mold are brought into contact with other, thereby forming a pattern made of the cured product of the imprint material.

As an imprint material, a curable composition (to be also referred to a resin in an uncured state) to be cured by receiving the curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, a visible light beam, and ultraviolet light. The curable composition can be a composition cured with light irradiation or heating. Among these compositions, the photo-curable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film obtained by connecting a plurality of droplets supplied by the imprint material supplier. The viscosity (the viscosity at 25° C.) of the imprint material is, for example, 1 mPa·s (inclusive) to 100 mPa·s (inclusive). Examples of the substrate material can be glass, a ceramic, a metal, a semiconductor, a resin, and the like. A member made of a material different from the substrate may be formed on the surface of the substrate, as needed. Examples of the substrate are a silicon wafer, a compound semiconductor wafer, and silica glass.

In the specification and the accompanying drawings, directions will be indicated by an XYZ coordinate system in which directions parallel to the surface of the substrate S are set as the X-Y plane. Assume that directions parallel to the X-axis, the Y-axis, and the Z-axis of the XYZ coordinate system are the X direction, the Y direction, and the Z direction, respectively. Assume that a rotation about the X-axis, a rotation about the Y-axis, and a rotation about the Z-axis are θX, θY, and θZ, respectively. Control operations or driving operations related to the X-axis, the Y-axis, and the Z-axis represent control operations or driving operations related to a direction parallel to the X-axis, a direction parallel to the Y-axis, and a direction parallel to the Z-axis, respectively. In addition, control operations or driving operations related to the θX-axis, the θY-axis, and the θZ-axis indicate control operations or driving operations related to a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning indicates control of the position and/or orientation. Alignment can include control of the position and/or orientation of at least one of the substrate and the mold.

The imprint apparatus 100 includes a mold driver 12 for holding and driving a mold 11, and a substrate driver 14 for holding and driving a substrate (for example, a wafer) 13. The mold driver 12 and the substrate driver 14 form a relative driving mechanism that changes the relative positions and relative postures of the mold 11 and the substrate 13. The imprint apparatus 100 also includes a detector (alignment scope) 15 for detecting an alignment error, a correction mechanism 16 for correcting the shape of the mold 11, and a controller CNT. In addition, the imprint apparatus 100 includes a supplier (dispenser) for supplying an imprint material onto the substrate 13, a bridge surface plate for supporting the mold driver 12, and a base surface plate 23 for supporting the substrate driver 14.

The mold 11 has a pattern region 11a in which a pattern to be transferred to an imprint material on the substrate 13 is formed. The mold 11 can be made of a material such as quartz that transmits energy (for example, ultraviolet rays) for curing the imprint material on the substrate 13. Mold-side marks 18 are formed in the pattern region 11a of the mold 11. The mold driver 12 can include a mold chuck for chucking the mold 11 by a chucking method such as vacuum suction or electrostatic attraction, a mold stage for holding the mold chuck, and a driving system for driving the mold stage. This driving system drives the mold 11 by driving the mold stage. The driving system can be so configured as to drive the mold 11 on a plurality of axes (for example, three axes including the Z-axis, the θX-axis, and the θY-axis, and preferably six axes including the X-axis, the Y-axis, the Z-axis, the θX-axis, the θY-axis, and the θZ-axis).

A pattern in the pattern region of the mold 11 is transferred to the imprint material of the substrate 13. The type, material, and shape of the substrate 13 are not particularly limited. The substrate 13 can be a single-crystal silicon substrate or an SOI (Silicon On Insulator) substrate. The substrate 13 can also be a compound semiconductor substrate or an insulating substrate. The supplier of the imprint apparatus 100 or an external supplier supplies (applies) an imprint material to the substrate 13. The substrate 13 may also be a substrate having no pattern or a substrate having a pattern. Normally, a plurality of shot regions are defined on a substrate having a pattern, and substrate-side marks 19 are formed in each of the plurality of shot regions.

The substrate driver 14 can include a substrate chuck (not shown) for chucking the substrate 13 by a chucking method such as vacuum suction or electrostatic attraction, a substrate stage 14a for holding the substrate chuck, and a driving system 14b for driving the substrate stage 14a. The driving system 14b drives the substrate 13 by driving the substrate stage 14a. The driving system 14b can be so configured as to drive the substrate 13 on a plurality of axes (for example, three axes including the X-axis, the Y-axis, and the θZ-axis, and preferably six axes including the X-axis, the Y-axis, the Z-axis, the θX-axis, the θY-axis, and the θZ-axis).

The detector 15 can be a scope for optically detecting (observing) the mold-side marks 18 formed on the mold 11 and the substrate-side marks 19 formed in each of the plurality of shot regions on the substrate 13. The detector 15 can detect the relative positions of the mold-side mark 18 and the substrate-side mark 19. Accordingly, the detector 15 can also be a scope including an optical system for simultaneously imaging two marks, that is, the mold-side mark 18 and the substrate-side mark 19 or a scope for detecting an interference signal of two marks or a signal that reflects the relative position of a moire or the like. The detector 15 need not be able to simultaneously detect the mold-side mark 18 and the substrate-side mark 19. For example, the detector 15 can also detect the relative positions of the mold-side mark 18 and the substrate-side mark 19 by obtaining the positions of the mold-side mark 18 and the substrate-side mark 19 with respect to a reference position arranged inside.

Figure 2:
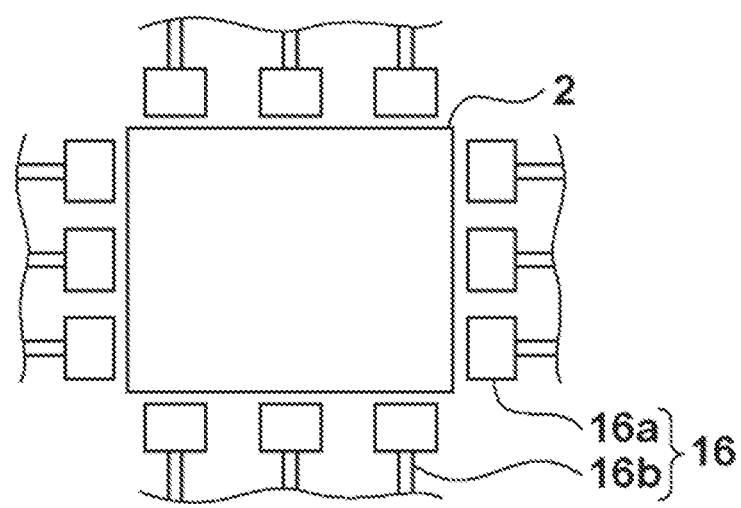
FIG. 2 is a view exemplarily showing a mold correction mechanism of the imprint apparatus.

The correction mechanism 16 can deform the pattern region 11a by applying a force to the mold 11 in a direction parallel to the pattern region 11a. For example, as shown in FIG. 2, the correction mechanism 16 can include a suction unit 16a for sucking the side surface of the pattern region 11a, and an actuator 16b for driving the suction unit 16a in a direction toward the side surface of the pattern region 11a and a direction away from the side surface of the pattern region 11a. Note that the correction mechanism 16 may also deform the pattern region 11a by controlling the temperature of the mold 11 by applying heat to the mold 11.

The controller CNT can be configured by a PLD (Programmable Logic Device) such as an FPGA (Field Programmable Gate Array), an ASIC (Application Specific Integrated Circuit), a versatile computer in which a program is installed, or a combination of all or some of them. The controller CNT controls an imprint process and processing related to the imprint process. For example, when performing the printing process, the controller CNT positions the mold 11 and the substrate 13 based on the detection result of the detector 15. Also, when performing the imprint process, the controller CNT controls the deformation amount of the pattern region 11a of the mold 11, which is deformed by the correction mechanism 16.

The mold-side mark 18 and the substrate-side mark 19 to be used in positioning of the mold 11 and the shot region of the substrate 13 will be explained with reference to FIGS. 3A and 3B. To simplify the explanation, an example of alignment between one shot region of the substrate 13 and the pattern region of the mold 11 will be explained. As will be described later, however, when the pattern region 11a of the mold 11 has an area corresponding to an aggregate of a plurality of shot regions of the substrate 13, the pattern region of the mold 11 is aligned with the aggregate of the plurality of shot regions of the substrate 13.

Figure 3A:
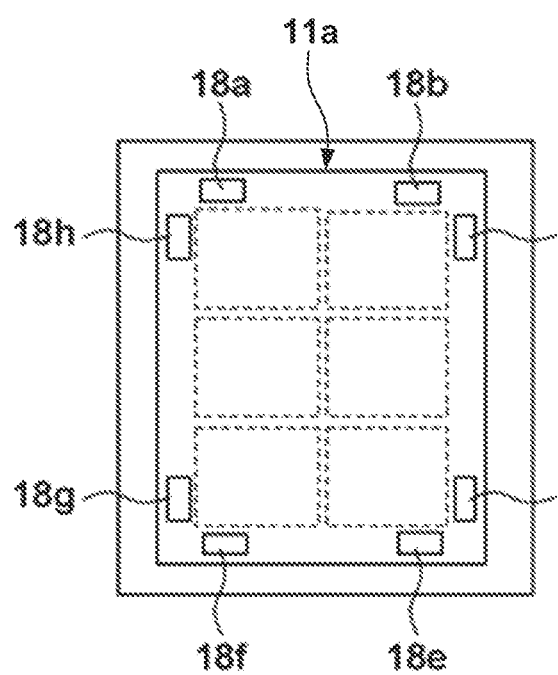
FIGS. 3A and 3B are views exemplarily showing the layout of mold-side marks and substrate-side marks.
Figure 3B:
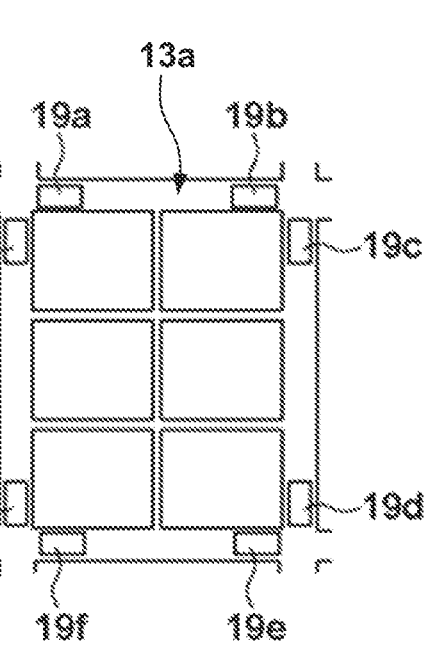

In this example shown in FIGS. 3A and 3B, six chip regions are arranged in one shot region on the substrate 13. FIG. 3A shows mold-side marks 18a to 18h formed in the four corners of the pattern region 11a of the mold 11. For example, the mold-side marks 18a, 18b, 18e, and 18f having the longitudinal direction in the horizontal direction are marks having a measurement direction in the X-axis direction. The mold-side marks 18c, 18d, 18g, and 18h having the longitudinal direction in the vertical direction are marks having a measurement direction in the Y-axis direction. Referring to FIG. 3A, regions surrounded by the dotted lines indicate regions in which patterns to be transferred to the six chip regions of the substrate 13 are formed.

FIG. 3B shows substrate-side marks 19a to 19h formed in the four corners of one shot region 13a of the substrate 13. For example, the substrate-side marks 19a, 19b, 19e, and 19f having the longitudinal direction in the horizontal direction are marks having a measurement direction in the X-axis direction. The substrate-side marks 19c, 19d, 19g, and 19h having the longitudinal direction in the vertical direction are marks having a measurement direction in the Y-axis direction. Referring to FIG. 3B, regions surrounded by the solid lines inside the shot region 13a indicate the chip regions.

When performing the imprint process, that is, when bringing the imprint material on the substrate 13 into contact with the mold 11, the mold-side marks 18a to 18h and the substrate-side marks 19a to 19h are positioned close to each other. Therefore, when the detector 15 detects the mold-side marks 18 and the substrate-side marks 19, the shape, position, and rotation of the pattern region 11a of the mold 11 can be compared with the shape, position, and rotation of the shot region 13a on the substrate 13. If large differences (deviations) are produced between the shape, position, and rotation of the pattern region 11a of the mold 11 and the shape, position, and rotation of the shot region 13a on the substrate 13, an overlay error exceeds an allowable range, and this leads to a pattern transfer defect (product defect).

FIGS. 4A to 4E are views exemplarily showing deviations produced between the shape, position, and rotation of the pattern region 11a of the mold 11 and the shape, position, and rotation of the shot region 13a on the substrate 13. Shape deviations between the mold 11 and the shot region 13a can include deviations specified as, for example, a magnification deviation, a trapezoid, and a twist.

FIG. 4A shows a case in which the deviation between the mold 11 and the shot region 13a is a positional deviation (shift). If it is detected that the mold-side marks 18 deviate in one direction from the substrate-side marks 19, it can be determined that the deviation between the mold 11 and the shot region 13a is a positional deviation (shift). FIG. 4B shows a case in which the deviation between the mold 11 and the shot region 13a is a magnification deviation. If it is detected that the mold-side marks 18 uniformly deviate outward or inward with respect to the center of the shot region 13a, it can be determined that the deviation is a magnification deviation. FIG. 4C shows a case in which the deviation between the mold 11 and the shot region 13a is a trapezoidal deviation. If it is detected that the mold-side marks 18 deviate outward or inward with respect to the center of the shot region 13a and the directions are different in the upper and lower portions or the left and right portions of the shot region 13a, it can be determined that the deviation is a trapezoidal deviation. Also, if it is detected that the mold-side marks 18 deviate outward or inward with respect to the center of the shot region 13a and the deviation amounts are different in the upper and lower portions or the left and right portions of the shot region 13a, it can be determined that the deviation is a trapezoidal deviation.

FIG. 4D shows a case in which the deviation between the mold 11 and the shot region 13a is a twist deviation. If it is detected that the mold-side marks 18 deviate in different directions in the upper and lower portions or the left and right portions of the shot region 13a, it can be determined that the deviation is a twist deviation. FIG. 4E shows a case in which the deviation between the mold 11 and the shot region 13a is a rotation deviation. If the mold-side marks 18 deviate in different directions in the upper, lower, left, and right portions of the shot region 13a and draw a circle around a given point inside the shot region in FIG. 4D, it can be determined that the deviation is a rotation deviation.

As shown in FIGS. 4B to 4D, if the deviation between the mold 11 and the shot region 13a is a magnification deviation, a trapezoidal deviation, or a twist, the controller CNT can deform the pattern region 11a of the mold 11 by the correction mechanism 16. More specifically, the controller CNT controls the amount of deformation of the pattern region 11a by the correction mechanism 16, so that the shape of the pattern region 11a becomes the shape of the shot region 13a. The controller CNT obtains data representing the correspondence between the driving amount of the actuator 16b (that is, the force to be applied to the mold 11) and the deformation amount of the pattern region 11a in advance, and stores the data in a memory or the like. Also, based on the detection result of the detector 15, the controller CNT calculates a deformation amount of the pattern region 11a, which is necessary to match the shape of the pattern region 11a with the shape of the shot region 13a. In other words, the controller CNT calculates a deformation amount of the pattern region 11a from the positional deviation amount between the mold-side marks 18 and the substrate-side marks 19 detected by the detector 15. Then, the controller CNT obtains a driving amount of the actuator 16b, which corresponds to the calculated deformation amount of the pattern region 11a, from the data stored in the memory, and drives the actuator 16b. After alignment and shape correction of the mold 11 and the shot region 13a are performed as described above, the pattern of the mold is transferred to the imprint material on the substrate 13.

The imprint process of transferring the pattern of the mold 11 to the imprint material on the substrate will be explained with reference to FIGS. 5A to 5C. First, as shown in FIG. 5A, an imprint material 20 is applied to an imprint target region (shot region) on the substrate 13. The controller CNT measures the relative positions of the mold-side marks 18 and the substrate-side marks 19 by the detector 15, and performs alignment of the imprint target region of the substrate 13 and the pattern region 11a of the mold 11 and shape correction of the mold 11. The mold 11 has the pattern region 11a in which a pattern to be transferred is formed, in addition to the mold-side marks 18 for alignment.

Then, as shown in FIG. 5B, the controller CNT brings the mold 11 into contact with the imprint material 20, and fills the imprint material 20 in recesses forming the pattern in the pattern region of the mold 11. In this step, the substrate-side marks 19 can be measured by visible light because the imprint material 20 transmits visible light. Also, when curing the imprint material 20 with ultraviolet light, the mold 11 can be made of, for example, quartz that transmits ultraviolet light. If a refractive index difference between the mold 11 and the imprint material 20 is small, the mold-side marks 18 cannot be measured by using only the recess-projection structure in some cases. Therefore, a method of coating the mold-side marks 18 with a material having a refractive index or transmittance different from that of the mold 11 and a method of changing the refractive index of the mark portion by ion irradiation or the like have been proposed. By using these methods, the detector 15 can measure the mold-side marks 18 even in the state shown in FIG. 5B.

FIG. 5C shows a state in which the imprint material 20 is cured by being irradiated with ultraviolet light and the mold 11 is removed from the substrate 13 after that. Ultraviolet irradiation transfers the pattern of the mold 11 to the substrate 13, and simultaneously transfers the mold-side marks 18 to the substrate 13, thereby generating transfer marks 21 on the substrate 13. The transfer marks 21 are patterns transferred onto the substrate, so an overlay test can be conducted between the transfer marks 21 and the substrate-side marks 19 by measuring the relative positions of these marks.

A feature must be formed on the mold 11 to be used in the imprint apparatus 100, at a magnification equal to that of the line width of a feature to be formed on the substrate. Also, when the imprint process is repeated, damages are accumulated on the mold 11 when the mold 11 is removed from the cured product of the imprint material, and this causes pattern breakage or the like. In a method of drawing the feature on the mold 11 by using an electron beam drawing apparatus or the like, the cost is enormous and so the production cost largely increases. Therefore, a method of forming a master mold and forming a replica mold by transferring the master mold to a blank mold has been proposed. In this case, pattern distortion, twist, or the like may occur during transfer. Also, in order to improve the productivity, a method of simultaneously transferring a pattern to a plurality of shot regions and a method of transferring a pattern onto the whole substrate at once have been proposed. However, when the area of the pattern region increases, a larger pattern distortion, twist, or the like may occur. In addition, a mold having a large area easily changes the shape.

The correction mechanism 16 deforms the pattern region 11a by applying a force to the mold 11. Therefore, a component and an amount correctable by the correction mechanism 16 are considerably limited. When an excessive force is applied to the mold 11 in order to perform correction, the mold 11 may break. Also, when the mold 11 has a larger area, it is difficult to deform a portion near the center by deformation by a pressure from the periphery.

In addition, as will be described in detail later, it is difficult to correct the array of a plurality of chip regions or a plurality of shot regions (in this case, base shot regions) within the pattern region of the mold 11 as shown in FIG. 9, by using a force applied to the side surface of the mold 11. Accordingly, it is impossible to correct all of these regions by only the correction mechanism 16.

When forming a base pattern (first pattern), therefore, it is effective to correct the first pattern into a pattern shape matching the shape of a pattern (second pattern) to be formed by the imprint apparatus 100 after that. In this embodiment, a method of manufacturing a pattern on the substrate 13 includes a first step, and a second step performed after the first step. In the first step, the first pattern is formed in each of a plurality of first regions (first shot regions) of the substrate 13 by using a scanning exposure apparatus. In the second step, the second pattern is formed by using the imprint apparatus in each of a plurality of second regions (second shot regions) of the substrate 13 having undergone the first step. Each of the plurality of second regions (second shot regions) is formed by at least two first regions of the plurality of first regions (first shot regions). That is, the sizes of the first region (first shot region) and the second region (second shot region) are different, and the second region is larger than the first region. In other words, a shot region when forming the base pattern by the scanning exposure apparatus (this is a region (first region) in which the pattern is formed by one-time scanning exposure) is different from a shot region when forming the pattern by the imprint apparatus 100 after that (this is a region (second region) in which the pattern is formed by a one-time imprint process).

A method of measuring the shape of a pattern formed in the pattern region 11a of the mold 11 will be explained below. A change in shape of the mold 11, which occurs when the mold driver 12 holds the mold 11, sometimes exerts a large influence on the shape of a pattern to be transferred onto the substrate 13 by using the mold 11. In this case, it is necessary to measure the shape of the pattern region 11a of the mold 11 with the mold 11 being held by the mold driver 12. As shown in FIG. 1, therefore, the mold driver 12 holds the mold 11 to be used. When the mold driver 12 holds the mold 11, a force is applied to the mold 11, so the mold 11 may be deformed. The deformation of the pattern region 11a of the mold 11 can be measured by measuring the shape of the pattern region 11a of the mold 11 by using a reference. This reference can be provided by a reference substrate or reference marks 22 formed on the substrate stage of the substrate driver 14. The reference substrate is a substrate formed for a test, and the positions of marks arranged on the reference substrate are accurately measured and managed in advance by using a measurement apparatus outside the imprint apparatus 100. The reference marks 22 are obtained by forming a pattern by using an electron beam drawing apparatus or the like, and accurately managed.

The shape of the pattern of the mold 11 can be measured by measuring the relative positions of the above-described reference and the marks formed on the mold 11 by using the method shown in FIGS. 4A to 4E. Note that in FIGS. 4A to 4E, the eight marks formed on the mold 11 are measured. However, when the pattern region is wide or measurement must be performed with a higher accuracy, the measurement is preferably performed at a larger number of points.

As shown in FIGS. 5A to 5C, when the pattern of the mold 11 is transferred onto the substrate 13, the mold-side marks 18 are transferred onto the substrate 13 together with the pattern. By measuring the transfer result of the mold-side marks 18, it is possible to obtain the shape of the transferred pattern resulting from the change in shape of the mold 11 during the imprint process. Furthermore, the behavior of transfer may change in accordance with a location on the surface of the substrate 13. For example, when performing imprinting near the center of the substrate 13 and when performing imprinting in the peripheral portion of the substrate 13, the holding state or the like of the substrate 13 changes, so the shape of the transferred pattern may change.

The possibility that the behavior is different from those in other cases especially when the pattern region 11a of the mold 11 overlaps the edge of the substrate 13 as shown in FIG. 6 is high. FIG. 6 shows a state in which six chip regions are supposed to be transferred as one shot region but only three chips can be transferred onto the substrate 13. From the viewpoint of the productivity, however, the imprint process should be performed even when it is possible to transfer only one chip region. In this case, the behavior of the transfer step highly likely changes compared to a case in which the imprint process is performed on the whole area of a shot region. Therefore, when a portion including the edge of the substrate 13 is to be transferred as shown in FIG. 6 or the transfer pattern shape changes on the surface of the substrate, the shape of the transfer pattern of the mold 11 must be obtained for each case. For example, the shape of a pattern transferred onto the substrate 13 by the method shown in FIGS. 5A to 5C can be measured by using a measurement device outside the imprint apparatus 100. These methods can obtain a more accurate shape because they can accurately obtain the shape of the transferred pattern.

Also, the shape of the transfer pattern can be obtained by transferring the pattern of the mold 11 to the reference substrate, and measuring the relative positions of the transferred marks and the marks formed on the reference substrate. In this case, the detector 15 of the imprint apparatus can also be used. The method shown in FIGS. 4A to 4E can be used as a method of measuring the shape from the relative positions of the two kinds of marks. Since this method does not require any measurement device outside the imprint apparatus, the shape can efficiently be measured, and it is unnecessary to prepare any additional measurement device. The reference substrate having the pattern accurately measured and managed beforehand by a measurement device outside the imprint apparatus is taken as an example of the reference for accurately measuring the pattern shape, but it is also possible to use a substrate to be actually used. An example is a so-called pilot wafer to be used to determine the imprint conditions before the imprint process is started.

In addition, when the difference between the base pattern and the pattern transferred by the imprint apparatus in an actual production process is fed back to the formation step of forming the base pattern by using a scanning exposure apparatus, the overlay accuracy can further be improved as the production advances.

It is also possible to obtain the shape of the transfer pattern as described above in a state in which the correction mechanism 16 is not performing correction, and use the difference obtained by subtracting the correction amount of the correction mechanism 16 from the difference between the obtained transfer pattern shape and the base pattern, as the correction amount of the scanning exposure apparatus. This further improves the adjustment of the shot shape because the correction mechanism of the imprint apparatus can correct a manufacturing error that can occur on the base pattern.

By contrast, it is also possible to obtain items and amounts that can be corrected as much as possible by the correction mechanism 16 as described above, and use the difference between the obtained transfer pattern and the base pattern as the correction amount of the scanning exposure apparatus. That is, items and amounts correctable by the imprint apparatus are corrected in the imprint apparatus, and other correction items and amounts are corrected on the base side, thereby dispersing the shape correction items and correction amounts between the mold and the base. This can suppress the change amount of the base shot shape as much as possible.

Since pattern transfer is performed many times in a series of steps, the allowable amount of the shot shape naturally exists. Therefore, this is a solution for a demand for minimizing the change amount of the base shot shape.

It is also possible to take account of the dependence of the deformation of the mold 11 on a combination of the imprint apparatus 100 and the mold 11. For example, when the deformation of the mold 11 when the mold 11 is held is the same in a plurality of imprint apparatuses, the same control need only be performed in the scanning exposure apparatus regardless of the imprint apparatus that performs the imprint process as long as the apparatus is of the same kind.

The difference in deformation of the mold 11 between imprint apparatuses can be obtained by measuring the same mold 11 in the same manner by a plurality of imprint apparatuses. If there is a difference in deformation of the mold 11 between the imprint apparatuses, a combination of the imprint apparatus and the mold 11 must be taken into consideration, and identification data thereof can be managed for that purpose.

The reproducibility can be obtained by repeating the processes from holding to measurement of the mold 11 by the same imprint apparatus a plurality of times. If the measurement results have a variation, the average shape of the measurement results is obtained, and the variation is finely corrected by the correction mechanism 16 of the imprint apparatus. The pattern shape to be transferred by the imprint apparatus can be obtained as described above.

The shape of the pattern (second pattern) to be transferred by the above-described imprint apparatus is fed back to adjustment of a scanning exposure apparatus 200 exemplarily shown in FIG. 7 when forming the base pattern (first pattern) by the scanning exposure apparatus 200. In other words, an overlay error between the first pattern and the second pattern on a substrate (first substrate) having undergone the second step is measured. Based on the measured overlay error, the scanning exposure apparatus 200 can be adjusted so as to reduce an overlay error between the first pattern and the second pattern to be formed on a new substrate (second substrate) through the first step and the second step after that.

Figure 8A:
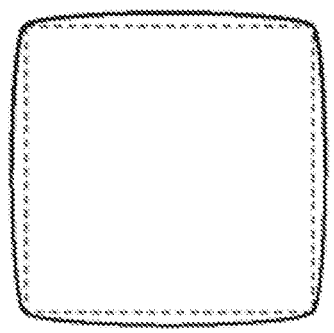
FIGS. 8A to 8E are views exemplarily showing shot region shape correction performed by the scanning exposure apparatus.

The occurrence of image distortion in the scanning exposure apparatus 200 will be explained below. Referring to FIG. 7, the scanning exposure apparatus 200 is an apparatus for exposing the substrate 13 while scanning a reticle R as an original and the substrate 13. In the scanning exposure apparatus 200, when at least one of a plurality of lens elements of a projection optical system PO, the reticle (original) R, or the substrate 13 is moved in a direction parallel to the optical axis of the projection optical system PO, an image change (magnification component) of a component symmetrical to the optical axis can occur. Also, symmetric distortion (barrel distortion) that changes a square pattern image indicated by the dotted lines in FIG. 8A into a shape as indicated by the solid lines can be generated by moving a specific lens element. When a system in which the reticle side is non-telecentric is used as the projection optical system PO, only the magnification can be changed by driving a specific lens element in the optical-axis direction of the projection optical system PO.

Figure 8B:
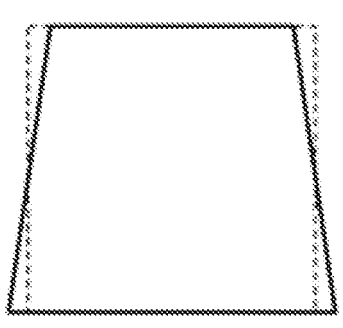

When the reticle R, the substrate 13, or a specific lens element is inclined to a plane perpendicular to the optical axis of the projection optical system PO, a square pattern can be changed into a trapezoidal pattern indicated by the solid lines as shown in FIG. 8B. That is, trapezoidal distortion can be generated by changing the magnification component around the rotation axis. Not only the lens elements but also other optical elements can be made drivable. It is also possible to make a lens group including a plurality of lenses drivable. An optical configuration determines a pattern shape to be obtained when the position or posture of a given lens element is moved. Therefore, a lens element to be moved is selected as needed.

When image distortion is generated, an image plane position (focus), coma aberration, and the like normally secondarily change, so the reticle R and the lens element can be driven to cancel the changes. This will briefly be explained by taking the image plane position (focus), coma aberration, and distortion as examples. For example, to change only the distortion, the imaging characteristics of the focus, coma aberration, and distortion are measured while independently driving the reticle R and the lens element in the stage of initial adjustment, thereby obtaining change coefficients of the abovementioned three imaging characteristics. Then, simultaneous linear equations with two unknowns are formulized by using the change coefficients of the two imaging characteristics excluding the focus and the driving amounts of the reticle R and the lens element, a predetermined amount is substituted for only the change coefficient of the distortion in the equations, and zero is substituted for the change coefficient of the coma aberration, thereby formulizing new simultaneous equations. The reticle R and the lens element need only be driven in accordance with the driving amounts obtained by solving the equations. The focus is excluded because if a lens or the like is driven to correct another imaging characteristic such as the distortion, the focus varies accordingly, so the focus must be corrected by using another detection unit. The focus can be corrected by changing a target value of a focus detection system (not shown) by taking account of the variation amount of the secondarily changed focus.

Figure 8C:
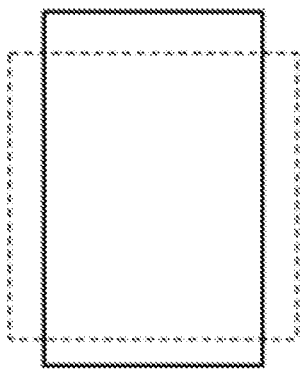
Figure 8D:
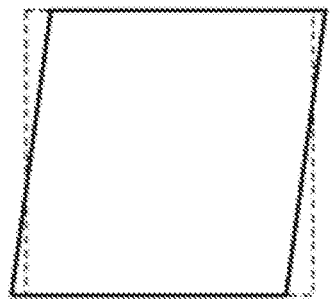
Figure 8E:
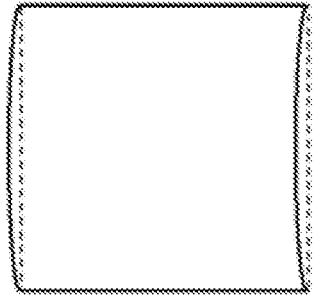

In practice, the scanning exposure apparatus transfers a pattern through scanning exposure, so changing the image shape of the projection optical system PO is insufficient. Since image distortion in the scanning direction is averaged during scanning, this must be taken into consideration. First, when changing the magnification, it is necessary to change the magnification of the projection optical system PO and the relative scanning speed (synchronous speed ratio) of the reticle R and the substrate 13. The magnification in the non-scanning direction can be changed by changing the magnification of the projection optical system PO, and the magnification in the scanning direction can be changed by changing the synchronous speed ratio of the reticle R and the substrate 13. By changing the magnifications in these directions, therefore, it is possible to generate image distortion (a rectangle component) that changes a square pattern indicated by the dotted lines in FIG. 8C into a rectangle pattern indicated by the solid lines. Image distortion (image distortion having the shape of a rhombus or a parallelogram) as indicated by the solid lines in FIG. 8D can also be generated by giving offset to the relative angle of the reticle R and the substrate 13 in the scanning direction. Furthermore, image distortion as indicated by the solid lines in FIG. 8E can be generated by gradually changing the relative angle of the reticle R and the substrate 13 in the scanning direction during scanning. Japanese Patent Laid-Open Nos. H06-310399 and H07-57991 describe details of the method of changing the magnification in the scanning direction by changing the synchronous speed ratio of the reticle and the substrate, and the method of generating image distortion by giving an offset to the relative angle of the reticle and the substrate in the scanning direction.

As described above, the scanning exposure apparatus 200 can independently generate image distortions in the scanning direction and the non-scanning direction, when transferring the pattern of the reticle R to the substrate 13 by relative scanning (synchronous movement) of the reticle R and the substrate 13. The scanning exposure apparatus 200 can also generate different image distortions in the scanning position by changing the conditions such as the synchronous speed ratio and the relative angle in the scanning direction during scanning.

By using the method as described above, a base having a shape (a first shot array) matching the shape (a second shot array) of a transfer pattern of the imprint apparatus 100, which is used in the second step, can be formed in the first step by using the scanning exposure apparatus 200. In the imprint process, it is necessary to secure a time during which the imprint material is filled in the recesses of the mold during pattern formation, and this may decrease the throughput. To suppress this decrease in throughput, the imprint apparatus 100 performs the imprint process by regarding a plurality of shot regions (first regions) having undergone pattern formation by the scanning exposure apparatus 200 as one shot region (second region).

Figure 9A:
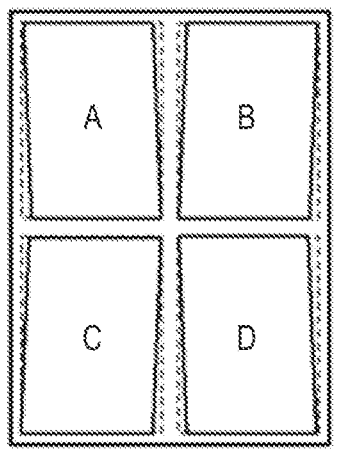
FIGS. 9A to 9C are views exemplarily showing the relationship between a shot region array in the scanning exposure apparatus that forms a pattern in a first step and a shot region array in the imprint apparatus that forms a pattern in a second step.
Figure 9B:
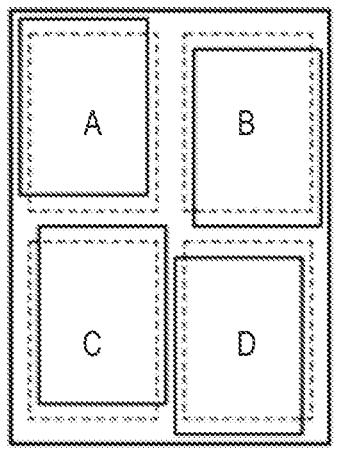

An example in which the imprint process is performed by regarding an aggregate of four shot regions (first regions) in which patterns are formed by the scanning exposure apparatus 200 as one shot region (second region) as shown in FIG. 9A will be explained below. In this example shown in FIG. 9A, four shot regions A to D have different shapes, and distortion having the shape of a bobbin as a whole occurs in the transfer region. As described above, the shape correctability (a correctable component and its amount) which the imprint apparatus 100 used in the second step has on the pattern region 11a is restricted more than the scanning exposure apparatus 200 used in the first step. Therefore, in accordance with the shape correctability of the imprint apparatus 100, the scanning exposure apparatus 200 adjusts the shapes of the four shot regions A to D forming the aggregate. As exemplarily shown in FIG. 9B, the scanning exposure apparatus 200 can also take account of the relative positions of the four shot regions A to D forming the aggregate.

Figure 9C:
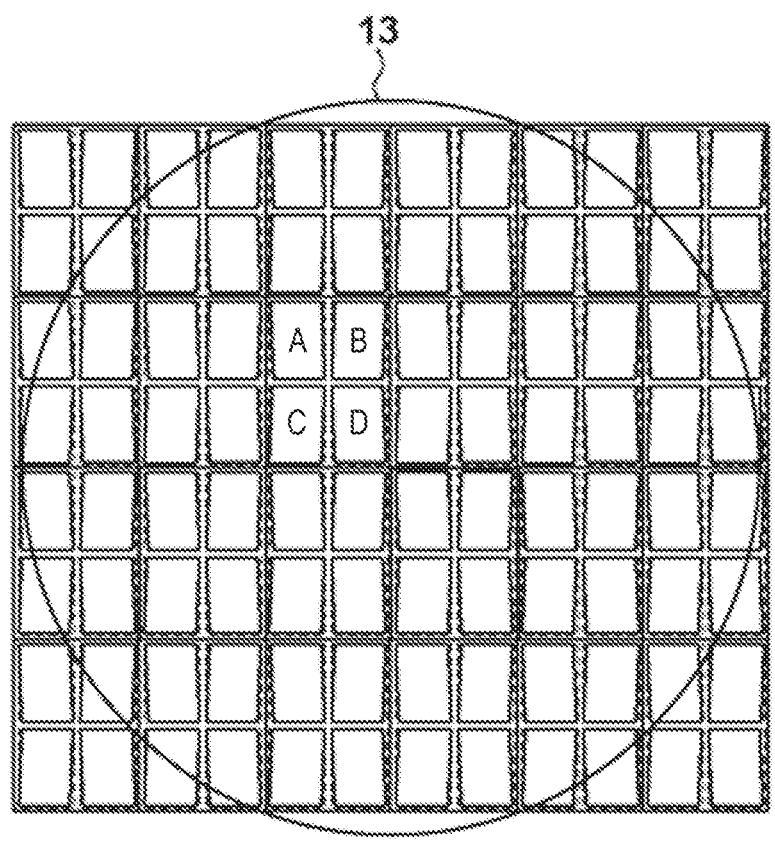

FIG. 9C shows the array of shot regions (first regions) when the scanning exposure apparatus 200 forms patterns, and the array of shot regions (second regions) when the imprint apparatus 100 forms patterns, by overlaying the arrays. The aggregate of the four shot regions (first regions)

in which patterns are formed by the scanning exposure apparatus 200 corresponds to one shot region (second region) in which a pattern is formed by the imprint apparatus 100.

The shape of each shot region in which a pattern is formed by the scanning exposure apparatus 200 may depend on the scanning direction in scanning exposure. If the throughput is not taken into consideration, therefore, equalizing the scanning directions in scanning exposure of four shot regions forming one aggregate (eventually, all shot regions of the substrate 13) is advantageous in improving the overlay accuracy between the pattern formed in the first step and the pattern formed in the second step. However, the throughput significantly decreases if scanning exposure of a plurality of consecutive shot regions is performed in the same scanning direction. This is so because when scanning exposure of a plurality of consecutive shot regions is performed in the same scanning direction, the reticle stage must be returned to the scanning start position between the scanning exposure processes. The throughput is minimized when scanning exposure of all shot regions of the substrate 13 is entirely performed in the same scanning direction.

To improve the throughput, therefore, the scanning exposure apparatus 200 preferably alternately switches the scanning directions in scanning exposure of a plurality of consecutive shot regions. This is so because when the scanning directions are alternately switched in scanning exposure of a plurality of consecutive shot regions, after scanning exposure of one shot region is complete, scanning exposure of the next shot region can be performed in a scanning direction opposite to the scanning direction of the former scanning exposure.

A method of manufacturing a pattern according to this embodiment advantageous in improving the throughput and the overlay accuracy will be explained below. In this embodiment, the method of manufacturing a pattern on the substrate 13 includes a first step, and a second step performed after the first step. In the first step, a first pattern is formed in each of a plurality of first regions (first shot regions) of the substrate 13 by using a scanning exposure apparatus. In the second step, a second pattern is formed by using an imprint apparatus in each of a plurality of second regions (second shot regions) of the substrate 13 having undergone the first step. Each of the plurality of second regions is formed by (an aggregate of) at least two first regions of the plurality of first regions. In the first step, the scanning direction of scanning exposure performed by the scanning exposure apparatus 200 is allocated to each of the at least two first regions.

Figure 11:
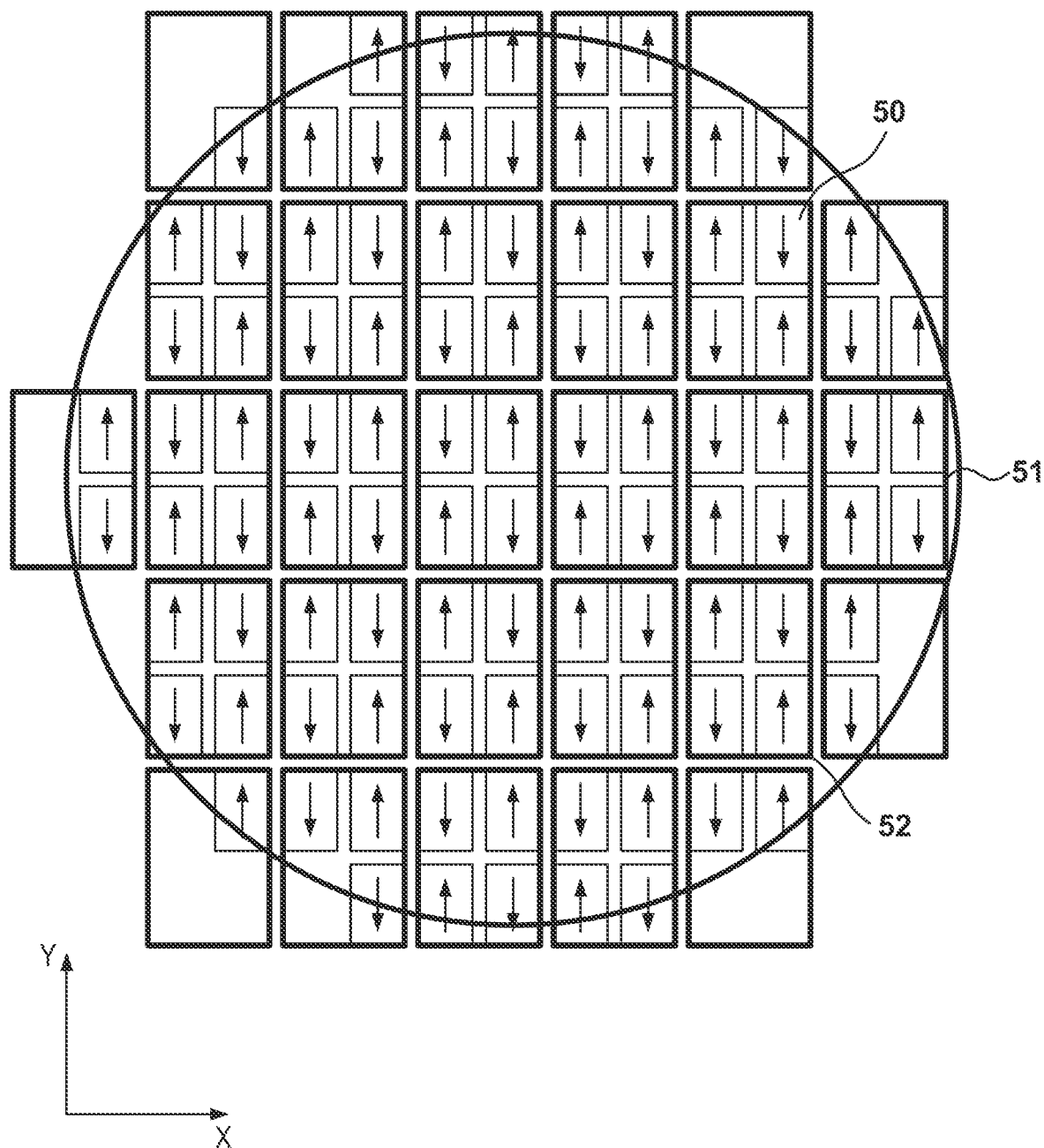
FIG. 11 is a view showing a comparative example.

FIG. 11 exemplarily shows the scanning directions of the scanning exposure apparatus 200 in the first step of a comparative example. Referring to FIG. 11, small rectangles (shot regions 50) are the first regions in which patterns are transferred (formed) by one-time scanning exposure in the first step, and large rectangles (for example, shot regions 51 and 52) are the second regions in which patterns are transferred (formed) by a one-time imprint process in the second step. In the first step, a pattern is formed as a latent image by scanning exposure, and a physical pattern is formed through a developing step performed after that. More specifically, the first step includes a step of performing scanning exposure on each of a plurality of first regions of a substrate by using the scanning exposure apparatus, a step of forming a resist pattern by developing the substrate after that, and a step of forming a first pattern by processing the substrate by using the resist pattern after that.

Figure 12A:
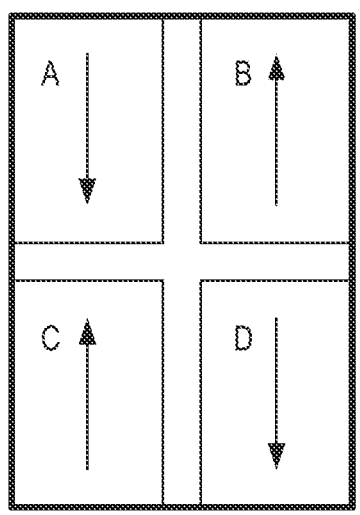
FIGS. 12A and 12B are views exemplarily showing combinations of scanning directions.
Figure 12B:
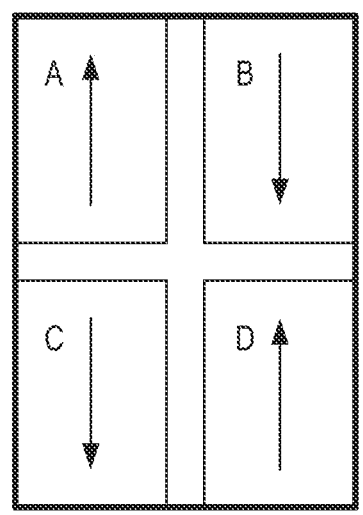

In this comparative example shown in FIG. 11, the scanning directions in scanning exposure for the plurality of consecutive shot regions (first regions) are alternately switched in order to improve the throughput. In the example shown in FIG. 11, combinations of the scanning directions allocated to at least two first regions (in this example, four shot regions each indicated by the small rectangle) forming the second region are different in the shot regions 51 and 52 as the second regions. That is, FIG. 12A shows a combination of the scanning directions in the four shot regions (first regions) of the shot region 51 as the second region. Also, FIG. 12B shows a combination of the scanning directions in the four shot regions (first regions) of the shot region 52 as the second region. Accordingly, the distortions of patterns formed in the shot regions 51 and 52 as the second regions by the scanning exposure apparatus 200 can be different from each other. In this comparative example, therefore, the overlay accuracy between the patterns formed by using the scanning exposure apparatus 200 and the patterns formed by using the imprint apparatus 100 may decrease.

In this embodiment, therefore, a combination of the scanning directions allocated to at least two first regions forming the second region is set or determined so as to be common to the plurality of second regions. Also, in this embodiment, this combination is determined such that the scanning directions are alternately changed one by one in at least the first regions arranged in a direction perpendicular to the scanning direction, of the at least two first regions to be processed by the scanning exposure apparatus. In a method like this, the throughput may become slightly lower than a maximum throughput, but can remarkably improve when compared to a case in which scanning exposure is performed in the same scanning direction on all shot regions (first regions) in the first step.

Figure 13:
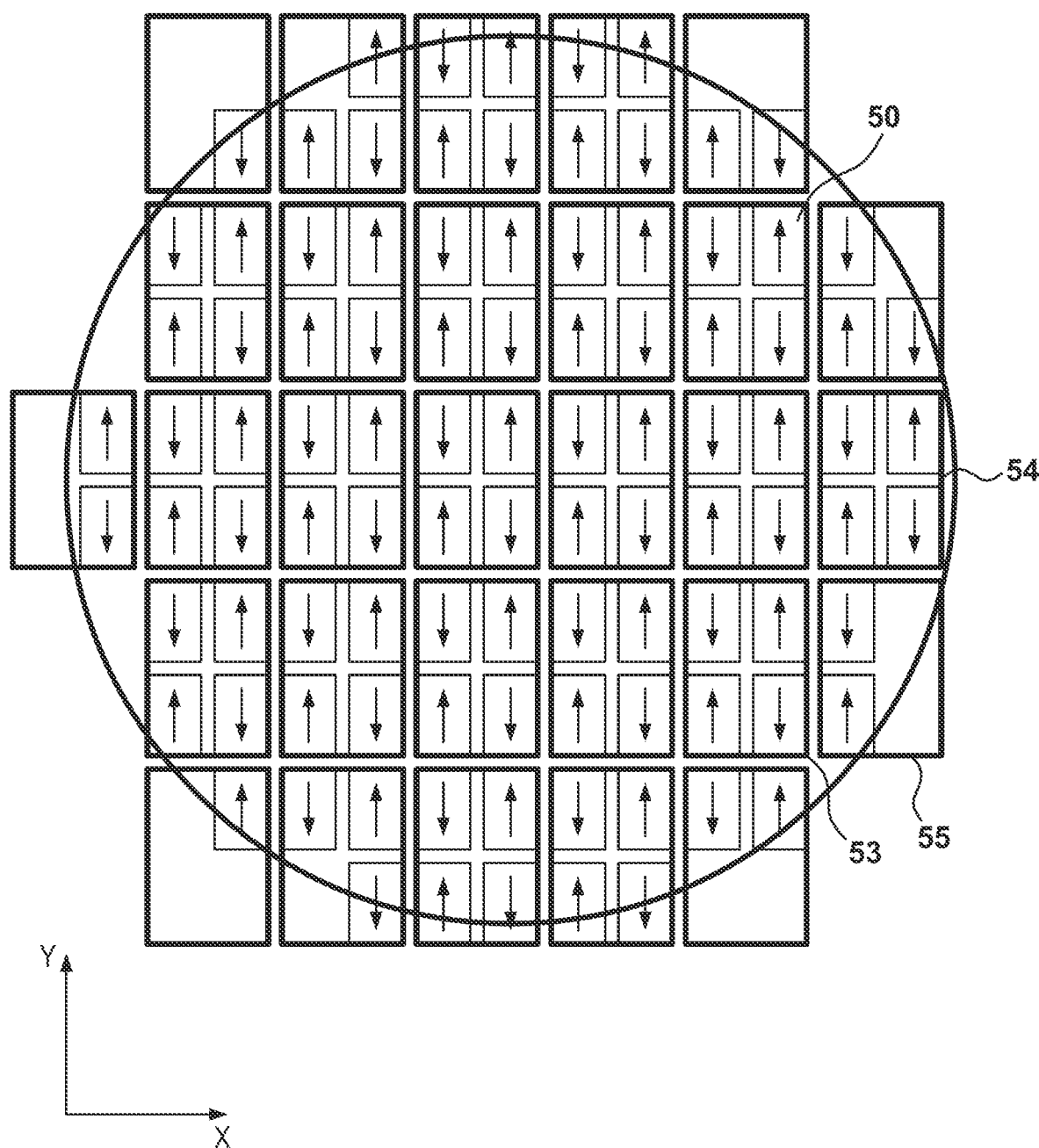
FIG. 13 is a view exemplarily showing scanning directions allocated to a plurality of shot regions (first regions) in this embodiment.

FIG. 13 exemplarily shows scanning directions allocated to a plurality of shot regions (first regions) in this embodiment. Referring to FIG. 13, small rectangles (shot regions 50) are the first regions in which patterns are transferred (formed) by one-time scanning exposure in the first step, and large rectangles (for example, shot regions 53, 54, and 55) are the second regions in which patterns are transferred (formed) by a one-time imprint process in the second step. In this example shown in FIG. 13, a combination of the scanning directions allocated to at least two first regions forming the second region is common to the plurality of second regions.

In the example shown in FIG. 13, combinations of the scanning directions allocated to at least two first regions (in this example, four shot regions each indicated by the small rectangle) forming the second region are the same in the shot regions 53 and 54 as the second regions. That is, FIG. 12A shows the combination of the scanning directions in the four shot regions (first regions) of the shot region 51 as the second region. FIG. 12A also shows the combination of the scanning directions in the four shot regions (first regions) of the shot region 52 as the second region.

A combination of the scanning directions can be determined such that the scanning directions are alternately changed one by one in the first regions forming a first row arranged in a direction perpendicular to the scanning directions, and can be determined such that the scanning directions are alternately changed one by one in the first regions forming a second row adjacent to the first row. The scanning directions allocated to the first regions on the first row, and the first regions on the second row, which are adjacent to the first regions on the first row, can be opposite directions.

The second step can include a step of forming a part of the second pattern in a third region (the shot region 55) of the substrate having undergone the first step. The third region (shot region 55) is formed by at least one first region of the plurality of first regions (shot regions 50). The third region is a region having an outer edge defined by the edge of the substrate. In the first step, a scanning direction in scanning exposure performed by the scanning exposure apparatus 200 is allocated to at least one first region forming the third region. The same scanning direction is allocated to the first region (shot region 50) forming the third region (shot region 55), and the first regions forming the second regions (shot regions 53 and 54), to which the pattern of the same region of the pattern region 11a of the mold 11 is to be transferred.

Figure 16A:
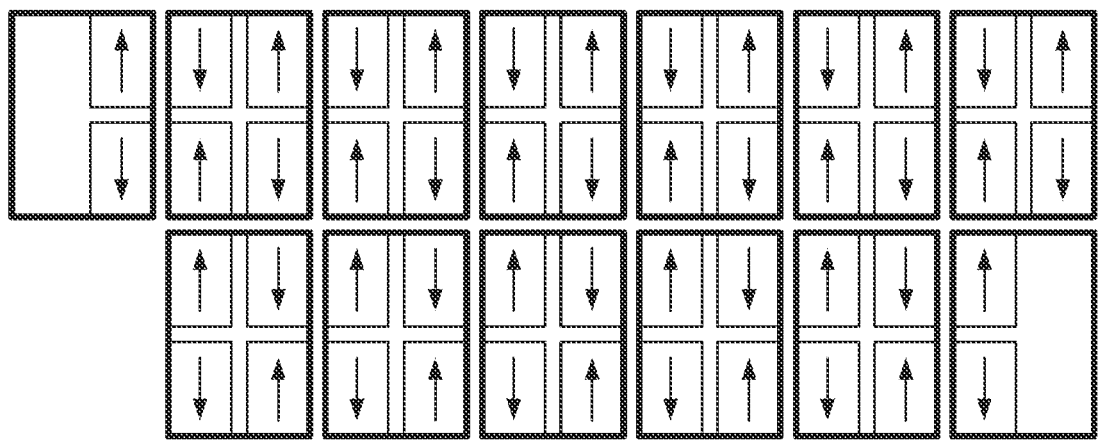
FIGS. 16A and 16B are views exemplarily showing a shot region array before shifting and a short region array after shifting.
Figure 16B:
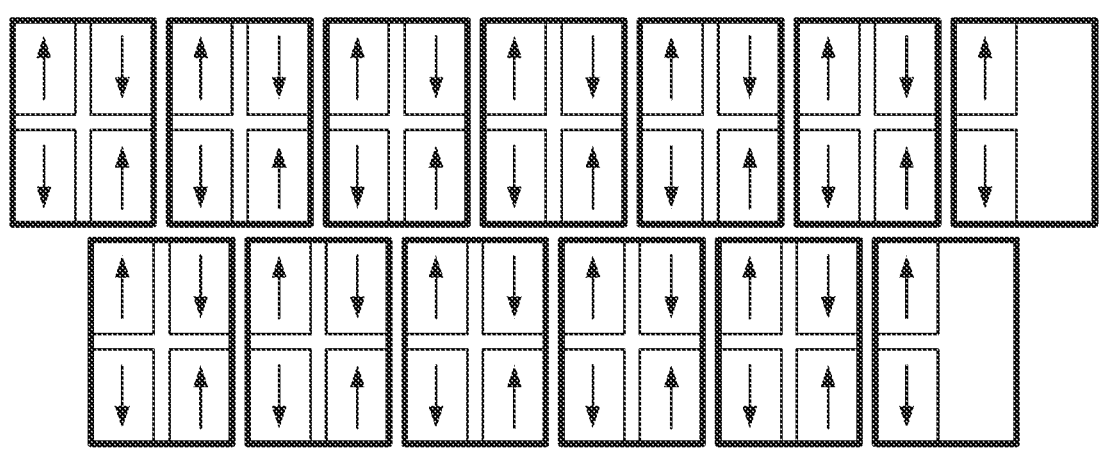

FIGS. 16A and 16B exemplarily show a method of arraying a plurality of shot regions (second regions) in the imprint apparatus 100 according to this embodiment. In this example shown in FIGS. 16A and 16B, the array of the plurality of shot regions (second regions) in the imprint apparatus 100 is so determined that combinations of the scanning directions allocated to at least two first regions forming the second region are the same in the second regions. FIG. 16A shows a temporary array of the plurality of shot regions (second regions) in the imprint apparatus 100 according to this embodiment. FIG. 16B shows the array of the plurality of shot regions (second regions) obtained by partially shifting the temporary array of the plurality of shot regions (second regions) shown in FIG. 16A in the X direction.

In the example shown in FIGS. 16A and 16B, after the scanning directions of the plurality of shot regions (first regions) in the scanning exposure apparatus 200 are determined, the array of the plurality of shot regions (second regions) in the imprint apparatus 100 is determined accordingly. By contrast, it is also possible to determine the scanning directions of the plurality of shot regions (first regions) in the scanning exposure apparatus 200, after the array of the plurality of shot regions (second regions) in the imprint apparatus 100 is determined.

The imprint apparatus 100 forms a second pattern by the imprint process in each shot region (second region) of the substrate after a first pattern is formed by using the scanning exposure apparatus 200 and predetermined processing (for example, etching) is further performed. In this step, the mold 11 and/or the substrate 13 can be deformed by using the correction mechanism 16 and/or a substrate deformation mechanism (not shown), such that the overlay error between the first pattern as the base and the second pattern falls within an allowable range. The substrate deformation mechanism can deform the substrate 13 by, for example, applying heat to the substrate 13.

The scanning directions in the scanning exposure apparatus 200 have been taken into consideration up to this point, but a step direction may also be taken into consideration. More specifically, for at least two first regions forming the second region, a step direction in the scanning exposure apparatus 200 can be allocated between the at least two first regions. This step direction allocated to the at least two first regions can be used commonly in the plurality of second regions. The step direction is, for example, the order of scanning exposure of the plurality of shot regions 50 arranged in the X direction, in the example shown in FIG. 13.

Figure 14:
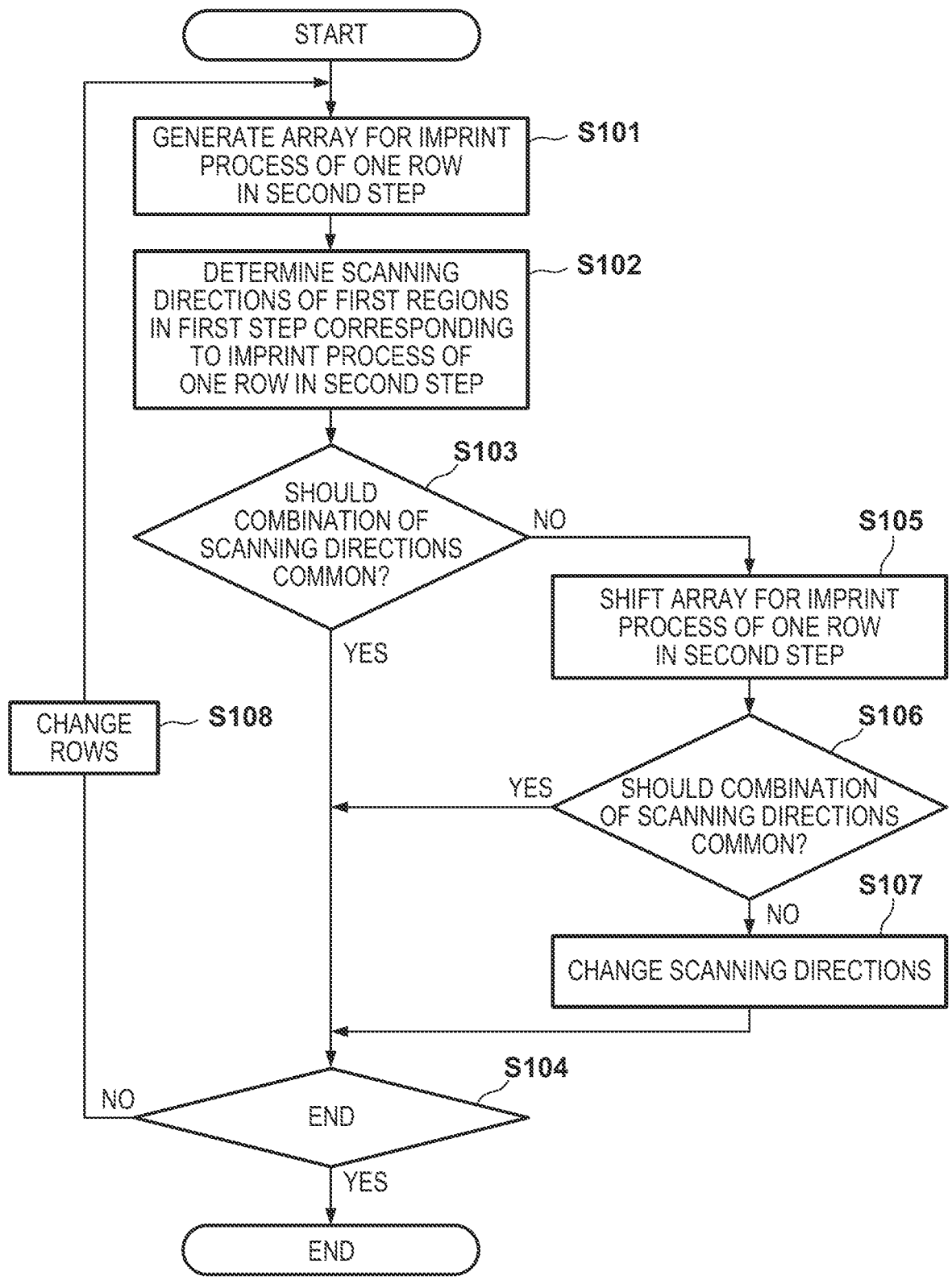
FIG. 14 is a view exemplarily showing a method of determining the scanning directions of a plurality of shot regions (first regions) in the first step and the array of a plurality of shot regions (second regions) in the second step.

FIG. 14 shows an example of the method of determining the scanning directions of the plurality of shot regions (first regions) in the first step and determining the array of the plurality of shot regions (second regions) in the second step. This method can be performed by, for example, a computer.

Figure 15:
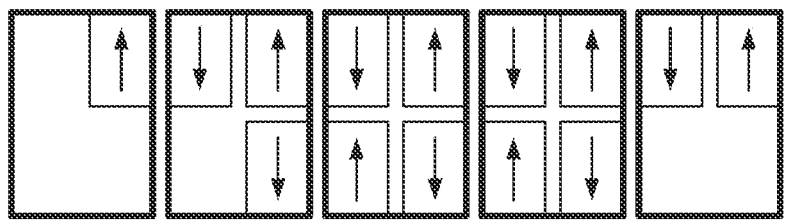
FIG. 15 is a view showing an example in which the scanning directions of the plurality of shot regions in the first step are determined for an imprint process of one row in the second step.

In step S101, the array of shot regions (second regions) for an imprint process of one row in the second step is determined. In step S102, the array of a plurality of shot regions (first regions) in the first step is determined for the one row for which the array is determined in step S101. In this step, the scanning directions are determined so that they are alternately switched. FIG. 15 illustrates an example in which the scanning directions of the plurality of shot regions in the first step are determined for the imprint process of one row in the second step.

In step S103, whether a combination of the scanning directions allocated to at least two first regions forming the second region should be common to the plurality of second regions is determined. Also, in third step S103, whether (a combination of) the same scanning directions are allocated to the first regions (shot regions 50) forming the third region (shot region 55) and the first regions forming the second regions (shot regions 53 and 54) is determined. These determinations can be performed by comparing the combination of the scanning directions allocated to the first regions forming the second regions of one row, for which the determination is already performed, with the combination of the scanning directions allocated to the first regions forming the second regions of one row, which is a current determination target. If it is determined that the combination of the scanning directions allocated to at least two first regions forming the second region is common to the plurality of second regions, the process advances to step S104; if not, the process advances to step S105. Also, if (a combination of) the same scanning directions are allocated to the first regions (shot regions 50) forming the third region (shot region 55) and the first regions forming the second regions (shot regions 53 and 54), the process advances to step S104; if not, the process advances to step S105.

In step S105, a new array is generated by shifting the array determined in step S101 by one shot region in the X direction in the first step, and the process advances to step S106. FIG. 16A shows an example of the array before shifting, and FIG. 16B shows an example of the array after shifting. In step S106, the same determination as in step S103 is performed. If the combination of the scanning directions allocated to at least two first regions forming the second region is common to the plurality of second regions, the process advances to step S104; if not, the process advances to step S107. Also, in step S106, if (a combination of) the same scanning directions is allocated to the first regions (shot regions 50) forming the third region (shot region 55) and the first region forming the second regions (shot regions 53 and 54), the process advances to step S104; if not, the process advances to step S107.

In step S107, the combinations of the scanning directions in the first step are changed such that the combination of the scanning directions allocated to at least two first regions forming the second region is common to the plurality of second regions. In addition, the combinations of the scanning directions in the first step are changed such that (a combination of) the same scanning directions is allocated to the first regions (shot regions 50) forming the third region (shot region 55) and first regions forming the second regions (shot regions 53 and 54).

Figure 17A:
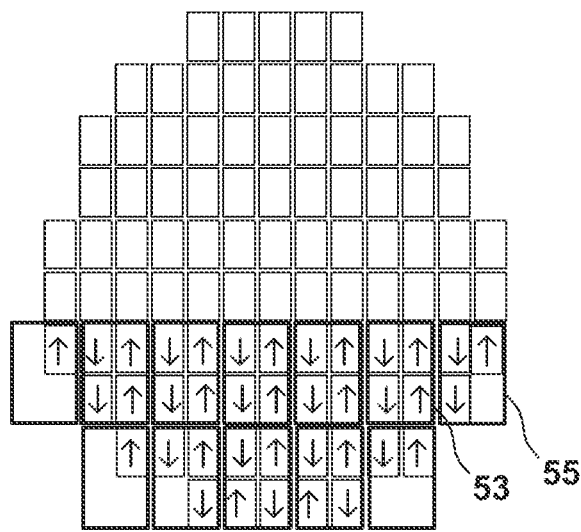
FIGS. 17A and 17B are views exemplarily showing changes in scanning directions.
Figure 17B:
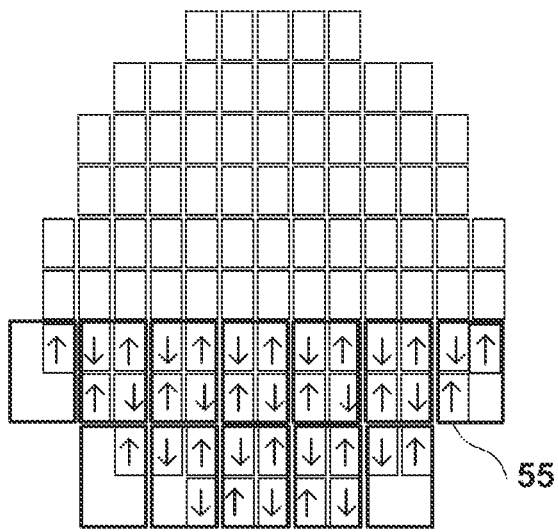

FIG. 17A shows a case in which a combination of the scanning directions in the shot regions 50 forming the third region (shot region 55) cannot be matched with a combination of the scanning directions in the second region (shot region 53) depending on shifting in the X direction in step S105. In this example, the same scanning directions are not allocated to the first regions (shot regions 50) forming the third region (shot region 55) and the first regions forming the second region (shot region 53), to which a pattern of the same region in the pattern region 11a of the mold 11 is to be transferred. In step S107, therefore, the scanning directions to be allocated to the first regions (shot regions 50) forming the third region (shot region 55) are changed. FIG. 17B shows the changed scanning directions.

In step S104, whether the determination of the scanning directions for all rows to be subjected to the imprint process in the second step is complete is determined. If the determination is complete, the process shown in FIG. 14 is terminated; if not, rows are changed in step S108, and the process advances to step S101.

In this example, the scanning directions of a plurality of shot regions in the first step and the array of a plurality of shot regions in the second step are determined. Shifting the shot regions (step S105) and changing the scanning directions (step S107) in the second step can improve the overlay accuracy in the second step while suppressing the decrease in throughput in the first step.

In the above example, attention is focused on only the overlay accuracy between two layers (the first pattern and the second pattern). However, it is also possible to focus attention on the overlay accuracy between three or more layers. In addition, the second step is performed by using the imprint apparatus in the above example, but the second step may also be performed by using another lithography apparatus (for example, a projection exposure apparatus capable of exposing a range broader than that of the exposure apparatus for the first step).

Figure 10:
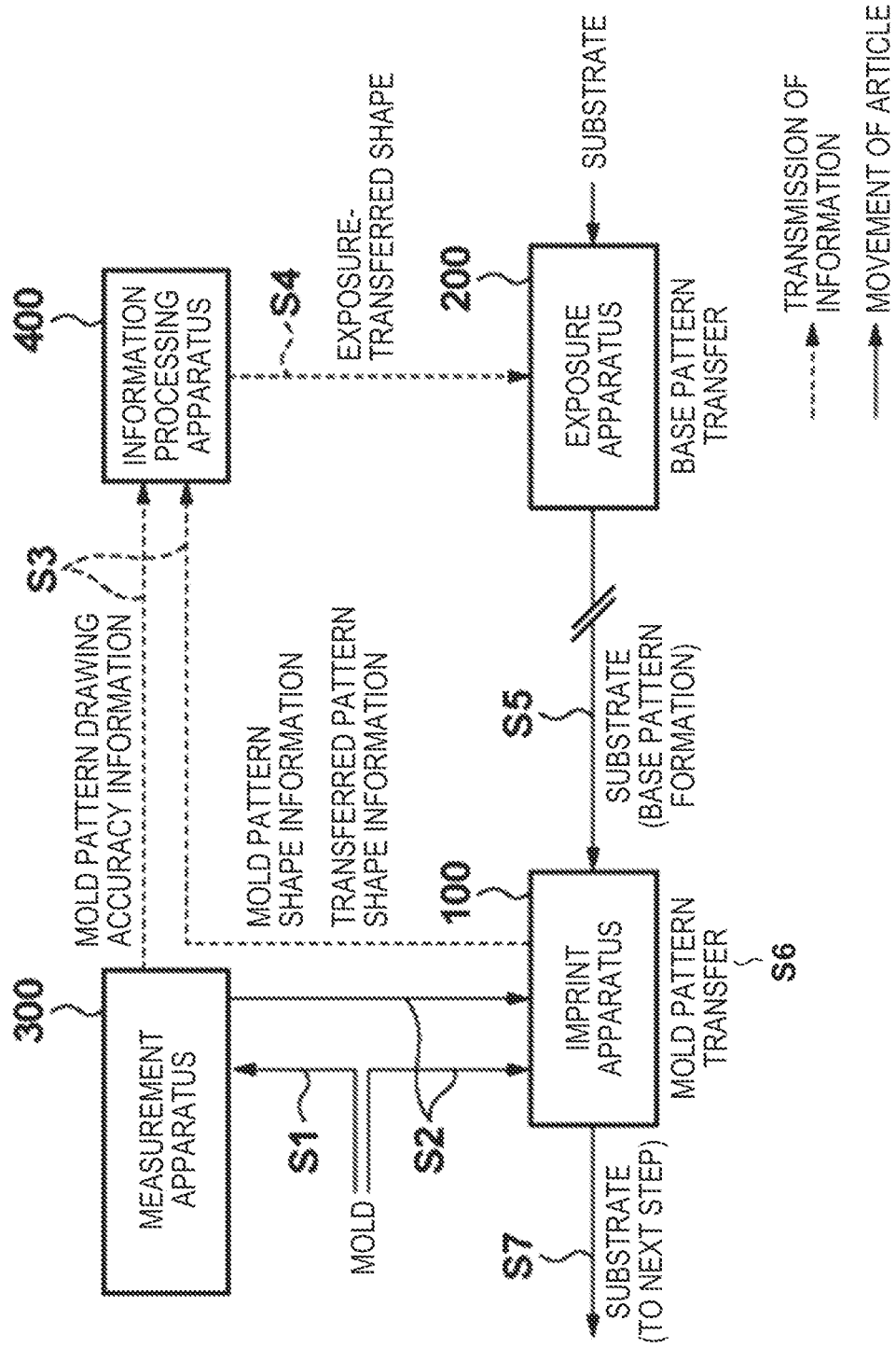
FIG. 10 is a view exemplarily showing the arrangement of a lithography system and a method of manufacturing a pattern.

A lithography system according to the present invention that forms a pattern on a substrate will be explained with reference to FIG. 10. The lithography system includes a measurement apparatus 300, an information processing apparatus 400, the imprint apparatus 100, and the scanning exposure apparatus 200. The lithography system also includes, for example, a developing apparatus for developing resist patterns formed by the imprint apparatus 100 and the scanning exposure apparatus 200, and an etching apparatus. The scanning exposure apparatus 200 defines a first shot array by forming a base pattern (first pattern) in each shot region on a substrate.

The imprint apparatus 100 forms a second pattern on the base pattern by performing processing in every one or more shot regions in the first shot array formed or defined by the scanning exposure apparatus 200, thereby forming or defining a second shot region. The measurement apparatus 300 performs measurement for obtaining a second shot array defined on the substrate when the imprint process is performed. The information processing apparatus (an obtaining unit) 400 obtains the measurement result of the measurement apparatus 300, and holds the measurement result as information of the second shot array.

The operations of the measurement apparatus 300, the information processing apparatus 400, the imprint apparatus 100, and the scanning exposure apparatus 200 and information exchange between them when the lithography system forms a pattern on a substrate will be explained below.

(Step S1) To measure the accuracy of the pattern formed in the pattern region 11a of the mold 11, the measurement apparatus 300 measures the pattern of the pattern region 11a. Consequently, the shape of the pattern region 11a itself is obtained.

(Step S2) If the influence of a change in pattern shape occurring when the imprint apparatus 100 holds the mold 11 or occurring in the imprinting step is large, the measurement apparatus 300 or the scope in the imprint apparatus measures the pattern shape.

(Step S3) The information processing apparatus 400 stores the measurement results in steps S1 and S2. If the pattern shape change depends on the combination of the mold 11 and the imprint apparatus 100, the information processing apparatus 400 holds and manages information of the combination and information of the measurement results as a set. The information processing apparatus 400 similarly manages deformation of a pattern in a shot region on the surface of the substrate or including the substrate edge.

(Step S4) Based on the held information, the information processing apparatus 400 transmits shape information of a base pattern to be formed by an exposure process to the scanning exposure apparatus 200. The scanning exposure apparatus 200 transfers the pattern by the exposure process based on the base pattern shape information received from the information processing apparatus 400.

(Step S5) The base pattern is formed through steps such as development and etching on the substrate 13 on which the base pattern is transferred by the scanning exposure apparatus 200.

(Step S6) The imprint apparatus 100 performs the imprint process on the substrate 13 on which the base pattern is formed, thereby transferring the pattern to the substrate 13. The information processing apparatus 400 manages a mold and an imprint apparatus used to imprint a pattern shape that matches the substrate 13 to be subjected to the imprint process. In accordance with an instruction of the information processing apparatus 400, the substrate 13 is supplied to the mold and the imprint apparatus matching the shape, and the process advances to the transfer step performed by imprinting.

(Step S7) The substrate 13 on which the pattern is transferred by the imprint apparatus 100 is supplied to next steps such as development and etching.

By performing steps S1 to S7 described above, the transfer pattern shape of the mold 11 can be matched with the base shape even when performing the imprint process on a plurality of shot regions at the same time. In this embodiment, the scanning exposure apparatus is used as the lithography apparatus for transferring the pattern to the base layer. However, it is also possible to use a charged particle beam drawing apparatus as the lithography apparatus for transferring the pattern to the base layer.

In the above embodiment, the imprint apparatus can perform shape correction by using the correction mechanism. As an example, a manufacturing variation more or less occurs on a substrate manufactured by the scanning exposure apparatus 200. This remains as a shot shape difference when the imprint apparatus 100 performs imprinting. The correction mechanism 16 of the imprint apparatus 100 can perform this micro shape correction.

As another example, correction can entirely be performed on the base side, but the allowable amount of the shot shape naturally exists because pattern transfer is performed a large number of times in series of steps. Therefore, there is a demand for making the deformation amount of the shot shape as small as possible. In this case, it is possible to perform a method of minimizing the base shape change by leaving amounts correctable by the imprint apparatus 100 behind and reflecting uncorrectable amounts on the base.

In that case, items and amounts correctable by the imprint apparatus 100 can be supplied to the information processing apparatus 400 in step S3, or the information processing apparatus 400 can hold these items and amounts as information beforehand if they are unique to the imprint apparatus. Then, a shape obtained by subtracting the items and amounts correctable by the imprint apparatus from the pattern shape supplied in step S3 is supplied to the scanning exposure apparatus 200 in step S4, thereby forming a base.

The formed base is supplied to the imprint apparatus 100, and the correction mechanism of the imprint apparatus 100 performs shape correction. This makes imprinting using shapes matching better (having smaller correction amounts) possible.

Note that only the correction mechanism 16 has been explained as an internal shape correction mechanism of the imprint apparatus of this embodiment, but the present invention is not limited to this. The method of the present invention is effective as long as a shape correction mechanism can perform correction in the imprint apparatus.

[Article Manufacturing Method]

An article manufacturing method according to an embodiment of the present invention is suitable for manufacturing an article, for example, a microdevice such as a semiconductor device or an element having a microstructure. This article manufacturing method includes a pattern formation step of forming a pattern on a substrate by using a lithography apparatus including the scanning exposure apparatus 200 and the imprint apparatus 100. Alternatively, the article manufacturing method includes a pattern formation step of forming the first pattern and the second pattern on the substrate by using the abovementioned method of manufacturing a pattern.

Furthermore, the article manufacturing method can include a processing step of obtaining an article by processing the substrate on which the patterns are formed through the pattern formation step. This processing step can include at least one or all of oxidation, film formation, vapor deposition, doping, planarization, etching, resist removal, dicing, bonding, packaging, and the like. Compared to the conventional methods, the article manufacturing method of this embodiment is advantageous in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-138012, filed Jul. 23, 2018, which is hereby incorporated by reference herein in its entirety.

What is claimed is:

1. A method comprising:
   first forming of forming a first pattern in each of a plurality of first regions of a first substrate by using a scanning exposure apparatus, wherein the scanning exposure apparatus includes a first corrector configured to correct a first pattern to be formed;
   second forming of forming a second pattern in each of a plurality of second regions of the first substrate having undergone the first forming;
   third forming of forming a first pattern in each of a plurality of first regions of a second substrate by using the scanning exposure apparatus while correcting the first pattern formed in each of the plurality of first regions of the second substrate using the first corrector, based on a difference between the first pattern formed in the first forming and the second pattern formed in the second forming; and
   fourth forming of forming a second pattern in each of a plurality of second regions of the second substrate having undergone the third forming,
   wherein each of the plurality of second regions includes at least two first regions of the plurality of first regions, and in the first forming, a scanning direction in scanning exposure performed by the scanning exposure apparatus is allocated to each of the at least two first regions,
   a combination of the scanning directions allocated to the at least two first regions is common to the plurality of second regions, and
   the combination is determined such that the scanning directions of at least first regions, of the at least two first regions, which are arranged in a direction perpendicular to the scanning directions are alternately changed one by one.

2. The method according to claim 1, wherein the combination is determined such that the scanning directions are alternately changed one by one for first regions arranged in the direction perpendicular to the scanning directions and forming a first row, and the scanning directions are alternately changed one by one for first regions forming a second row adjacent to the first row.

3. The method according to claim 2, wherein the scanning directions allocated to the first region of the first row, and the first region of the second row, which is adjacent to the first region of the first row, are opposite to each other.

4. The method according to claim 1, wherein in the second forming, a pattern of a mold is transferred to the at least two first regions at the same time by using an imprint apparatus.

5. The method according to claim 4, wherein the second forming includes forming a part of the second pattern in a third region of the substrate having undergone the first forming, and the third region includes at least one first region of the plurality of first regions,
   in the first forming, a scanning direction of scanning exposure performed by the scanning exposure apparatus is allocated to the at least one first region forming the third region, and
   the same scanning direction is allocated to the first region forming the third region and the first region forming the second region, to which a pattern of the same region of a pattern region of the mold is to be transferred.

6. The method according to claim 1, wherein
   a step direction to be set between the at least two first regions by the scanning exposure apparatus is allocated to the at least two first regions, and
   the step direction allocated to the at least two first regions is common to the plurality of second regions.

7. The method according to claim 1, wherein in the fourth forming, the second pattern is formed in each of the plurality of second regions of the second substrate while correcting the second pattern formed in each of the plurality of second regions of the second substrate using a second corrector, and
   wherein a correction amount of correcting the first pattern in the third forming is determined in accordance with (i) a correction amount of correcting the second pattern in the fourth forming and (ii) the difference between the first pattern formed in the first forming and the second pattern formed in the second forming.

8. The method according to claim 1, wherein the first forming includes performing scanning exposure on each of the plurality of first regions of the substrate by using the scanning exposure apparatus, forming a resist pattern by developing the substrate thereafter, and forming the first pattern by processing the substrate by using the resist pattern thereafter.

9. The method according to claim 1, wherein the scanning exposure apparatus is an apparatus for performing scanning exposure on the substrate while scanning an original and the substrate.

10. An article manufacturing method comprising:
forming the first pattern and the second pattern on the second substrate by using a method as defined in claim 1; and
processing the second substrate having undergone the forming, thereby obtaining an article.

11. The method according to claim 7, wherein the correction amount of correcting the second pattern in the fourth forming is determined based on a correction capacity of the second corrector, before the correction amount of correcting the first pattern in the third forming is determined.

12. A method of manufacturing a pattern on a substrate, comprising:
first forming of forming a first pattern in each of a plurality of first regions of the substrate by using a scanning exposure apparatus; and
second forming of forming a second pattern in each of a plurality of second regions of the substrate having undergone the first forming,
wherein each of the plurality of second regions includes at least two first regions of the plurality of first regions, and in the first forming, a scanning direction in scanning exposure performed by the scanning exposure apparatus is allocated to each of the at least two first regions,
a combination of the scanning directions allocated to the at least two first regions is common to the plurality of second regions,
the combination is determined such that the scanning directions of at least first regions, of the at least two first regions, which are arranged in a direction perpendicular to the scanning directions are alternately changed one by one, and
wherein a determination is made whether a combination of the scanning directions allocated to the plurality of first regions should be common to the plurality of second regions.

13. The method according to claim 12, wherein the determination is made using a first array of the second regions in the direction perpendicular to the scanning directions and a second array of the second regions determined by one first region by shifting the first array.

* * * * *